US012687775B2

(12) United States Patent
Progler et al.

(10) Patent No.: US 12,687,775 B2
(45) Date of Patent: Jul. 21, 2026

(54) SYSTEM, METHOD AND PROGRAM PRODUCT FOR PHOTOMASK SURFACE TREATMENT

(71) Applicant: PHOTRONICS, INC., Brookfield, CT (US)

(72) Inventors: Christopher Progler, Plano, TX (US); Young Mog Ham, Meridian, ID (US)

(73) Assignee: PHOTRONICS, INC., Brookfield, CT (US)

( * ) Notice: Subject to any disclaimer, the term of this patent is extended or adjusted under 35 U.S.C. 154(b) by 651 days.

(21) Appl. No.: 18/123,428

(22) Filed: Mar. 20, 2023

(65) Prior Publication Data

US 2023/0305385 A1 Sep. 28, 2023

Related U.S. Application Data

(60) Provisional application No. 63/323,705, filed on Mar. 25, 2022.

(51) Int. Cl.
 *G03F 1/72* (2012.01)

(52) U.S. Cl.
 CPC ...................................... *G03F 1/72* (2013.01)

(58) Field of Classification Search
 CPC ..... G03F 1/72; G03F 1/50; G03F 1/60; G03F 1/84
 See application file for complete search history.

(56) References Cited

U.S. PATENT DOCUMENTS 6,844,123 B1 1/2005 Ekberg et al.
2008/0107970 A1* 5/2008 Tanabe ...................... G03F 1/72
430/5

| 2008/0176381 A1 | 7/2008 | Aspar et al. |
| 2008/0305406 A1 | 12/2008 | Kominato et al. |
| 2011/0204024 A1 | 8/2011 | Moriya |
| 2012/0134024 A1 | 5/2012 | Lander et al. |
| 2012/0134025 A1 | 5/2012 | Hart |
| 2015/0205196 A1 | 7/2015 | Orihara et al. |

FOREIGN PATENT DOCUMENTS

| KR | 20090105911 A | 10/2009 |
| KR | 20100127116 A | 12/2010 |
| KR | 20110097657 A | 8/2011 |
| KR | 20130135879 A | 12/2013 |
| TW | 201921102 A | 6/2019 |
| TW | 202036155 A | 10/2020 |
| WO | 2015046095 A1 | 4/2015 |

OTHER PUBLICATIONS

International Search Report and Written Opinion issued to Application No. PCT/US2023/015617, mailed Jun. 28, 2023.
Korean Non-Final Rejection issued in Application No. 10-2024-7015174, dated Sep. 19, 2025.
Office Action issued in ROC (Taiwan) Patent Application No. 113132495, filed Mar. 25, 2023.

* cited by examiner

*Primary Examiner* — Stewart A Fraser
(74) *Attorney, Agent, or Firm* — AMSTER, ROTHSTEIN & EBENSTEIN LLP

(57) ABSTRACT

A method of manufacturing a photomask including the steps of providing a photomask blank, inspecting the photomask blank to determine presence of one or more defects in the photomask blank, wherein the one or more defects comprise one or more photomask substrate defects, and compensating for the one or more photomask substrate defects by roughening one or more surface portions of the photomask substrate.

13 Claims, 12 Drawing Sheets

PROVIDE PHOTOMASK BLANK

PERFORM PHOTOMASK INSPECTION

COMPENSATE FOR SUBSTRATE DEFECTS

S01          S03          S05

Substrate 4

Pellicle Membrane 10

Opaque Material 6

Frame 8

SYSTEM, METHOD AND PROGRAM PRODUCT FOR PHOTOMASK SURFACE TREATMENT

RELATED APPLICATIONS

This application claims priority to and the benefit of U.S. Provisional Patent Application No. 63/323,705, filed Mar. 25, 2022 and entitled SYSTEM, METHOD AND PROGRAM PRODUCT FOR PHOTOMASK SURFACE TREATMENT, the contents of which are incorporated herein by reference in their entirety.

FIELD OF THE INVENTION

The present invention generally relates to manufacturing of photomasks, and more particularly to manufacturing of photomasks used in flat panel display (FPD) and integrated circuit (IC) lithography.

BACKGROUND

A photomask is conventionally made up of an optically transparent substrate with opaque light blocking regions that in combination selectively block or pass optical wavelengths to form the circuit patterns of interest for the lithography projection system to image. These photomasks are commonly used in photolithography and production for integrated circuit (IC) and flat panel display (FPD) manufacturing, in particular by producing a pattern on a substrate such as a silicon wafer in the case of IC manufacturing or a glass panel in the case of FPD manufacturing. The optically transparent substrate of a photomask is typically a highly polished slab of fused silica upon which, for example, a chrome metal absorbing film is deposited and subsequently patterned in the mask making process. Other films deposited on the substrate for patterning might include CrOx, CrOn and MoSi or SiN for phase shifting applications. Typical operating wavelengths of an optical photomask include but are not limited to 436 nm, 365 nm, 248 nm, and 193 nm. The photomask has contributed greatly to the capability and productivity of IC and FPD manufacturing.

Photomasks are highly sensitive components in the manufacturing process because an image of the photomask appears in every exposed field in the IC or FPD pattern transfer process. Thus, single defects on a photomask can wipe out a large number of IC and FPD devices during the photolithographic process. Defects can come about in various ways such as during patterning of the mask, embedded in films deposited on the mask, and from additive contamination and/or defects embedded in the substrate material. Buried defects residing within the transparent substrate material of a photomask are commonly referred to as "inclusions." These inclusions can arise during the substrate manufacturing process from sources such as air bubbles or impurities in the fused silica material itself. The inclusions can reside anywhere within the substrate and because they are embedded in the hard fused silica material once formed it is extremely difficult to repair them. For this reason, substrate manufacturers spend much time and money producing substrates substantially free of inclusions.

There is an ongoing need for improved techniques in minimizing defects in photomask substrates.

SUMMARY OF THE INVENTION

An object of this invention is to minimize the influence and impact of buried defects (inclusions) residing within the transparent substrate material of a photomask.

Another object of this invention is to provide a method of treating a substrate to minimize the impact of inclusions to an acceptable level in the lithographic imaging so as have a positive effect on the substrate manufacturing time, cost and availability constraints. In embodiments, surface treatment is performed to reduce the imaging impact of the inclusions and hence enable far lower cost and more widely available substrate materials.

In accordance with an exemplary embodiment of the present invention, a method of manufacturing a photomask comprises: (A) providing a photomask blank; (B) inspecting the photomask blank to determine presence of one or more defects in the photomask blank, wherein the one or more defects comprise one or more photomask substrate defects; and (C) compensating for the one or more photomask substrate defects by roughening one or more surface portions of the photomask substrate.

In exemplary embodiments, the step of compensating comprises roughening one or more surface portions of the photomask substrate by at least one of grinding or polishing.

In exemplary embodiments, the step of compensating comprises roughening one or more surface portions of the photomask substrate by an oxidation process.

In exemplary embodiments, the step of compensating comprises roughening one or more surface portions of the photomask substrate by a film coating process.

In exemplary embodiments, the step of compensating comprises roughening one or more surface portions of the photomask substrate by a particle coating process.

In exemplary embodiments, the step of compensating comprises roughening one or more surface portions of the photomask substrate by wet etching with an acid etchant.

In exemplary embodiments, the step of compensating comprises roughening one or more surface portions of the photomask substrate by ionization.

In exemplary embodiments, the step of compensating comprises roughening one or more surface portions of the photomask substrate by sputtering.

In exemplary embodiments, the photomask is a large-size photomask for use in a lithography process to manufacture a flat panel display (FPD).

In exemplary embodiments, a method of making a flat panel display comprises irradiating light from an optical energy source through a large-size photomask and onto a glass plate substrate in a photolithographic process so that the at least one circuit pattern is transferred from the large-size photomask to the glass plate substrate, where the large-size photomask is made in accordance with a process comprising: A) providing a photomask blank; (B) inspecting the photomask blank to determine presence of one or more defects in the photomask blank, wherein the one or more defects comprise one or more photomask substrate defects; and (C) compensating for the one or more photomask substrate defects by roughening one or more surface portions of the photomask substrate.

In exemplary embodiments, the flat-panel display is a liquid crystal display, an active matrix liquid crystal display, an organic light emission diode, a light emitting diode, a plasma display panel, or an active matrix organic light emission diode.

These and other features and advantages of the present invention will be presented in more detail in the following detailed description and the accompanying figures which illustrate by way of example principles of the invention.

DESCRIPTION OF THE DRAWINGS

Various exemplary embodiments of this invention will be described in detail, with reference to the following figures, wherein.

DETAILED DESCRIPTION

Flat-panel displays (FPDs) are electronic viewing technologies used to display content (e.g., still images, moving images, text, or other visual material) in a range of entertainment, consumer electronic, personal computer, and mobile devices, and many types of medical, transportation and industrial equipment. The current FPD types include, for example, LCD (Liquid Chrystal Display), AM LCD (Active Matrix Liquid Chrystal Display), OLED (Organic Light Emission Diode), LED (Light Emitting Diode), PDP (Plasma Display Panel) and AMOLED (Active Matrix OLED).

During manufacture of an FPD, an FPD lithography system irradiates light onto a photomask on which the original thin-film-transistor (TFT) circuit patterns are drawn, and the light exposes the patterns onto a glass plate substrate through a lens. On a large glass plate, the exposure process is repeated several times in order to form the patterns onto the entire plate.

Figure 12A:
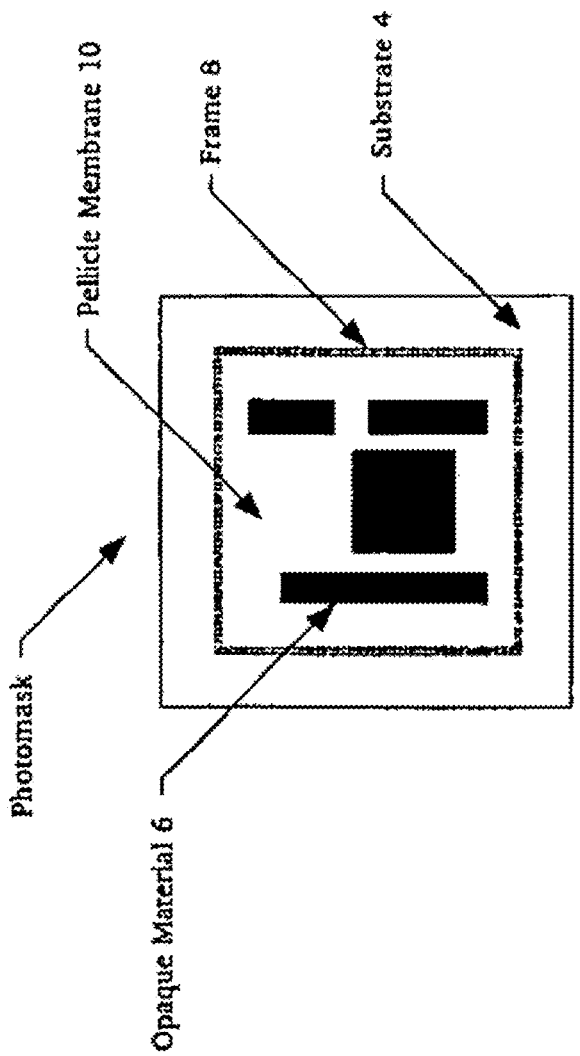
FIGS. 12A and 12B depict a top and side view of a typical photomask configured for use in a photolithographic process.
Figure 12B:
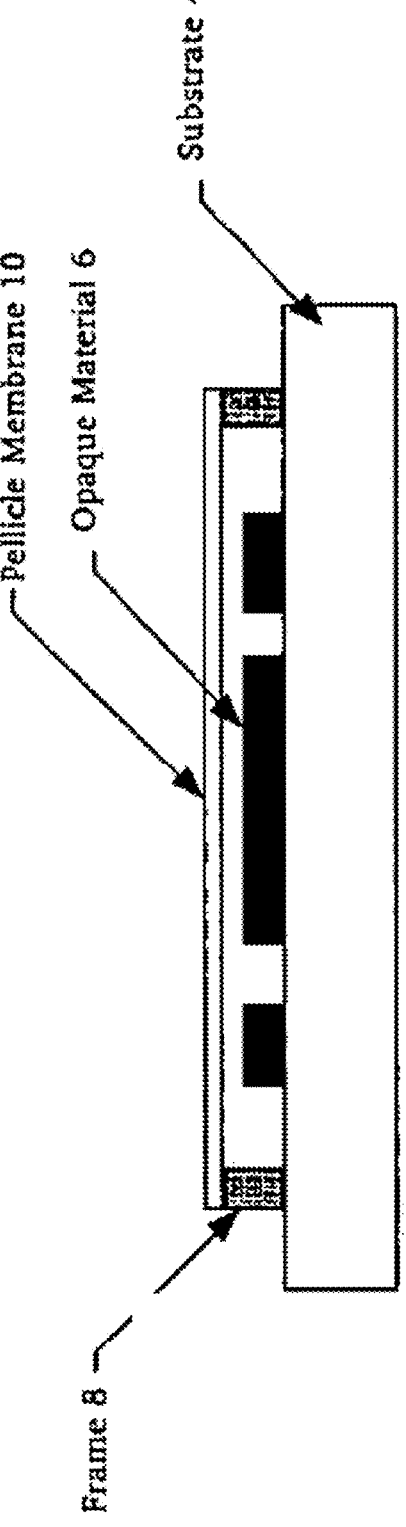

FIGS. 12A and 12B depict a top and side view of a typical photomask configured for use in a photolithographic process. As shown, photomask 2 (typically six inches by six inches in size and one-quarter inch thick) is comprised of transparent substrate 4 (e.g., fused silica) and the pattern layer of masking material 6 (e.g., chromium) defining the desired image to be created on the device. Pellicle frame 8 extends around the perimeter of the patterned masking material 6 and is affixed to the substrate 4 via a deposition process as well known in the art. Pellicle membrane 10 is stretched over and affixed to the upper surface of frame 8. As shown, the surface of pellicle membrane 10 is generally parallel to the surface of the photomask and covers the entire patterned area of masking material 6. Thus, any contamination which would otherwise land on the photomask instead falls on the pellicle membrane 10 staying out of the exposure system focal plane.

Another type of known photomask is commonly referred to as a phase shift photomask. Phase shift photomasks are generally preferred over binary photomasks where the design to be transferred to the device includes smaller, tightly packed feature sizes which are below the resolution requirements of optical equipment being used. Phase shift photomasks are engineered to be 180 degrees out of phase with light transmitted through etched areas on the photomask so that the light transmitted through the openings in the photomask is equal in amplitude.

One type of known phase shift photomask is commonly referred to as an embedded-attenuated phase shift mask ("EAPSM"). EAPSMs (not shown) typically include a substantially transparent material (such as fused silica) which is commonly referred to as a photomask substrate. The next layer is typically an embedded phase shifting material ("PSM layer") such as molybdenum silicide oxynitride (MoSiON), tantalum silicon nitride (TaSiN), titanium silicon nitride (TiSiN) or zirconium silicon oxide (ZrSiO) and other known phase materials. The next layer is typically an opaque material, such as chromium (Cr), which may optionally include an anti-reflective coating such as chromium oxynitride (CrON). The top layer is a photosensitive resist material. As with binary photomasks, the desired pattern of opaque material to be created on the EAPSM is scanned by an electron beam (E-beam) or laser beam in a raster or vector fashion across the blank EAPSM. As the E-beam or laser beam is scanned across the blank EAPSM, the exposure system directs the E-beam or laser beam at addressable locations on the EAPSM. In the case of a positive photosensitive resist material, the areas that are exposed to the E-beam or laser beam become soluble, while the unexposed portions remain insoluble. In the case of a negative photosensitive resist material, the unexposed areas become soluble, while the exposed portions remain insoluble.

Another type of phase shift mask is an alternating aperture phase shift mask ("AAPSM"). Like a binary photomask, an AAPSM is typically comprised of a layer of opaque material and a substantially transparent substrate which is etched on one side of the opaque features, while not etched on the other side (i.e., etching of the transparent substrate occurs in alternating locations in the substantially transparent substrate). More particularly, the AAPSM (not shown) includes a substantially transparent layer (e.g., fused silica) and an opaque layer (e.g., chrome). The opaque layer is etched to form opaque regions and alternating substantially transparent regions. The substantially transparent regions are further etched such that the AAPSM has recesses in the substantially transparent layer. In other words, the AAPSM has substantially transparent regions (which are un-etched) that alternate with etched recesses between each opaque region.

The effect of this structure when placed in an exposure system is to create light intensity of alternating polarity and 180 degree out of phase. This alternating polarity forces energy transmitted from the exposure system to go to zero at opaque regions while maintaining the same transmission of light at the alternating transparent regions and recesses. Since the photoresist layer on the device substrate is insensitive to the phase of the exposed light, the positive and negative exposed regions appear the same, while the zero region in between is clearly delineated. Thus, a sharper contrast between light (e.g., transparent) and dark (e.g., opaque) regions in the resulting photoresist layer of a device is obtained, thereby making it possible to etch a more accurate image onto the device substrate.

In mask manufacturing, substrate defects or particles are key factors that impact yield and cost. Since FPD blanks are thicker and larger than IC masks and particles such as bubbles are often generated during the large glass melting process, this impact on yield and cost is emphasized in FPD product manufacturing.

In accordance with exemplary embodiments of the present invention, a photomask substrate is subjected to surface treatment to minimize inclusion defects. An object of this treatment is to scatter the light that was disrupted by the inclusion during transmission through the substrate. That is, as the photomask illumination beam moves through the substrate, it is optically disrupted by the inclusion defect. This disruption moves with the illuminating beam to the imaging surface of the photomask where it becomes a printable defect leading to yield loss in the lithography process. However, in embodiments, the disrupted transmitted light is effectively scattered at the imaging surface so as to average out or smear the impact of this inclusion defect to minimize the effect of the inclusion to an acceptable level. Especially in the case of FPD lithography where the substrates are very large, this can have a profound effect on the cost structure and available capacity of the entire FPD manufacturing process.

It should be appreciated that the systems and methods described herein are not limited to FPD masks, but may also be applied to IC masks.

In embodiments, imaging surface scattering may be achieved in a variety of ways to provide an inclusion defect optical smoothing effect. The surface scattering properties are preferably fairly strong to smooth out the impact of the inclusion defect and have at least the following properties:

1. Sufficient surface scattering effect to degrade or scramble the directionality of the transmitted optical beam through the substrate. The surface scattering is preferably nominally structure-less from the point of view of the imaging conditions of the lithography scanner imaging the photomask; and
2. Retain high transmission of the optical wavelengths through the scattering surface despite the beam directionality scrambling effect.

While any surface modification technique that imparts the required surface scattering effect to minimize the impact of substrate inclusions may be employed, in embodiments the following techniques may be used to affect this scatter-based inclusion smoothing function on the substrate surface:

1. Surface grinding that will leave a fine scale ground glass type of finish to the substrate imaging surface. This is preferably done prior to the deposition of the patterning films and mask manufacturing.
2. Sputtering or additive deposited material or film method that leaves behind a deposited film of sufficient scattering structure to create a ground glass like effect on the transmitted beams through the mask substrate.
3. Surface oxidation or chemical etching-based methods to impart the scattering profile in the surface.
4. Patterned features at a fine enough scale to not image in the lithography system but strong enough to scramble the optical field disrupted by the inclusion defects.

Figures 1A, 1B, 1C, 1D, 1E:
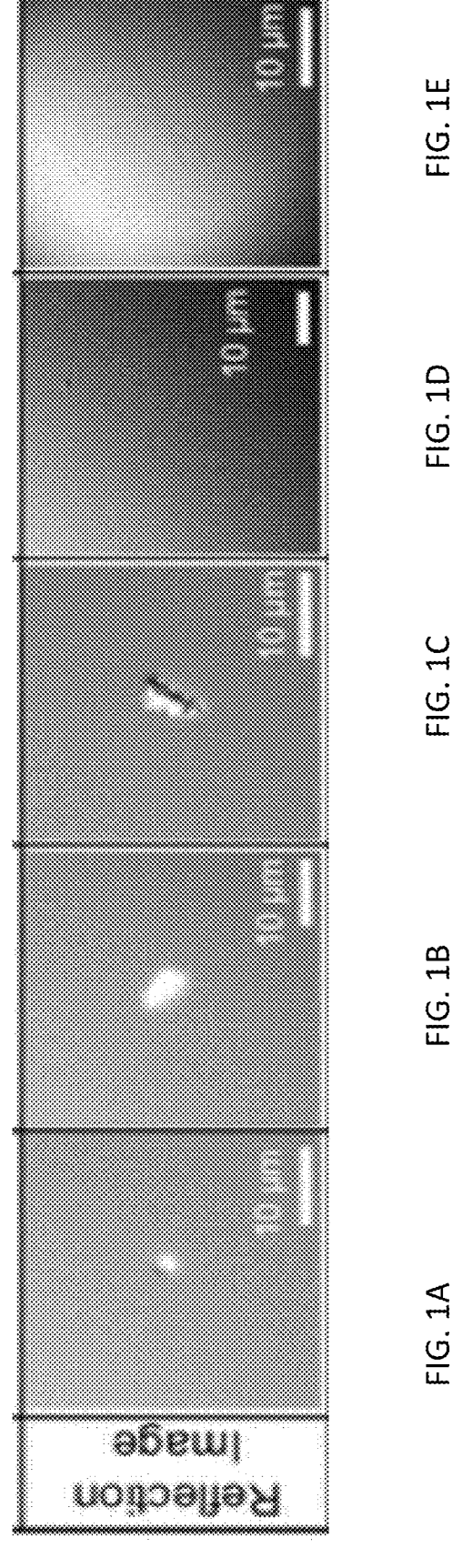
FIGS. 1A-1E are micrographs showing types of defects that may be addressed by exemplary embodiments of the present invention.
Figure 2:
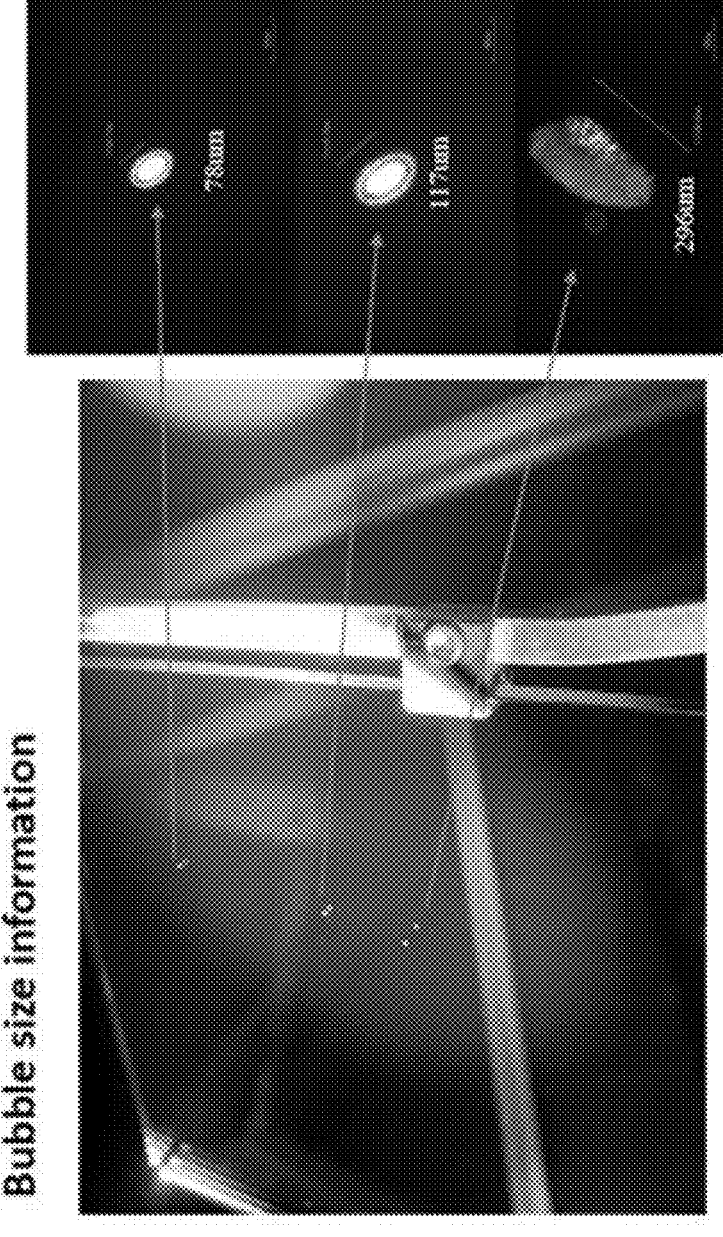
FIG. 2 is a micrograph showing types of defects that may be addressed by exemplary embodiments of the present invention.

FIGS. 1A-1E and 2 show the types of defects that may be addressed by the embodiments of the present invention. FIGS. 1A-1E show typical additive defects occurring after the substrate is built and polished and ready for coating. These might come from defects in deposited films or have evolved during the photomask manufacturing process. In particular, FIG. 1A shows a pinhole defect, FIG. 1B shows a crescent defect, FIG. 1C shows an additive defect, FIG. 1D shows a shading defect, and FIG. 1E show a diffuse defect. FIG. 2 shows inclusion type defect examples that are physically embedded in the substrate fused silica or glass material during its manufacture. They are typically generated when the fused silica material is in the formation process in the furnace or during a glass melting process. In embodiments, this latter type of inclusion defect may be optimally treated by surface scattering.

Figure 4:
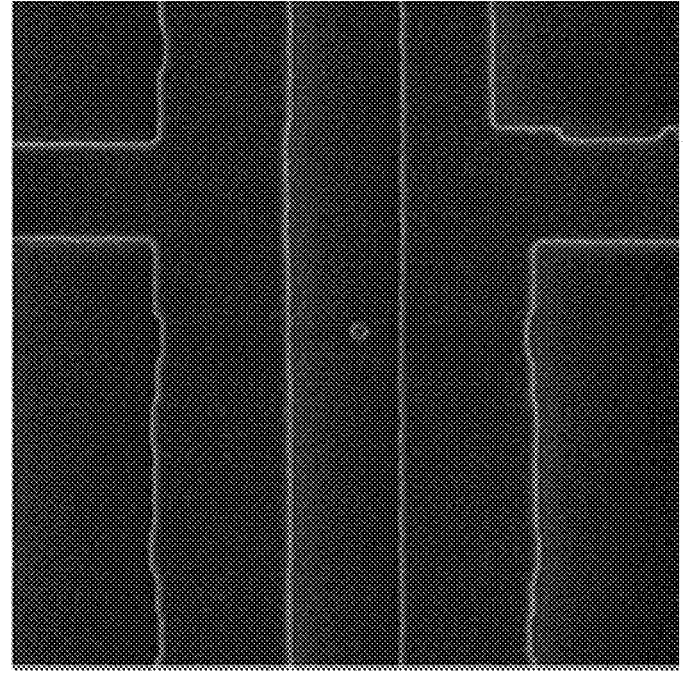
FIG. 4 is a micrograph showing the same portion of the photomask in FIG. 3 with a defect.
Figure 3:
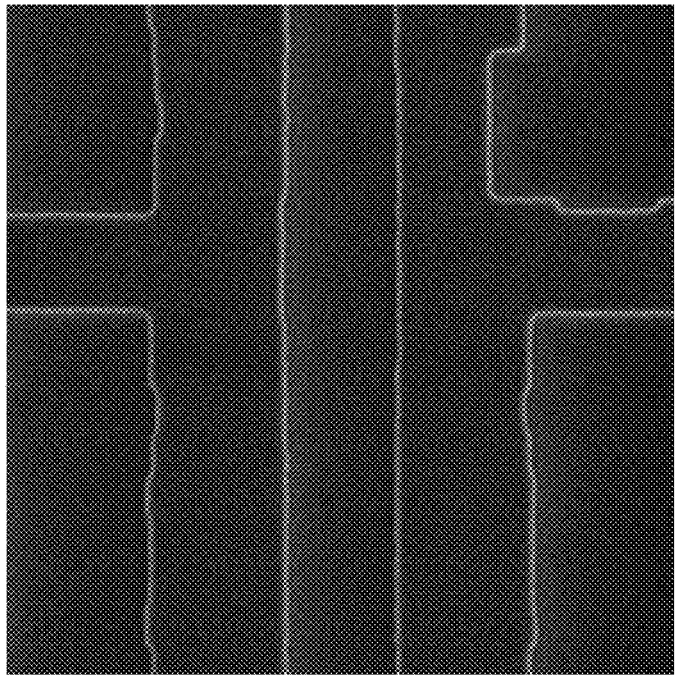
FIG. 3 is a micrograph showing a portion of a photomask without defects.

FIGS. 3 and 4 illustrates how defects manifest in the mask and imaging process. In FIG. 3, no discernible defect on the mask is present while in FIG. 4 the mask pattern is defective due to the hard spot in the middle of a line. The defect can impact patterning areas that are critical for the device imaging. Thus, in embodiments, acceptable defect sizes and percent light intensity loss may be defined to judge the defect severity. When exposure light passes through defining mask patterns on the thin films, intensity or maximum intensity of that light will be reduced or perturbed by the defect due to a physical blocking or interference effect. There are many types, sizes and locations of defects and the critical ones will have a measurable impact on the quality of the imaged mask pattern on the substrate.

Figure 5:
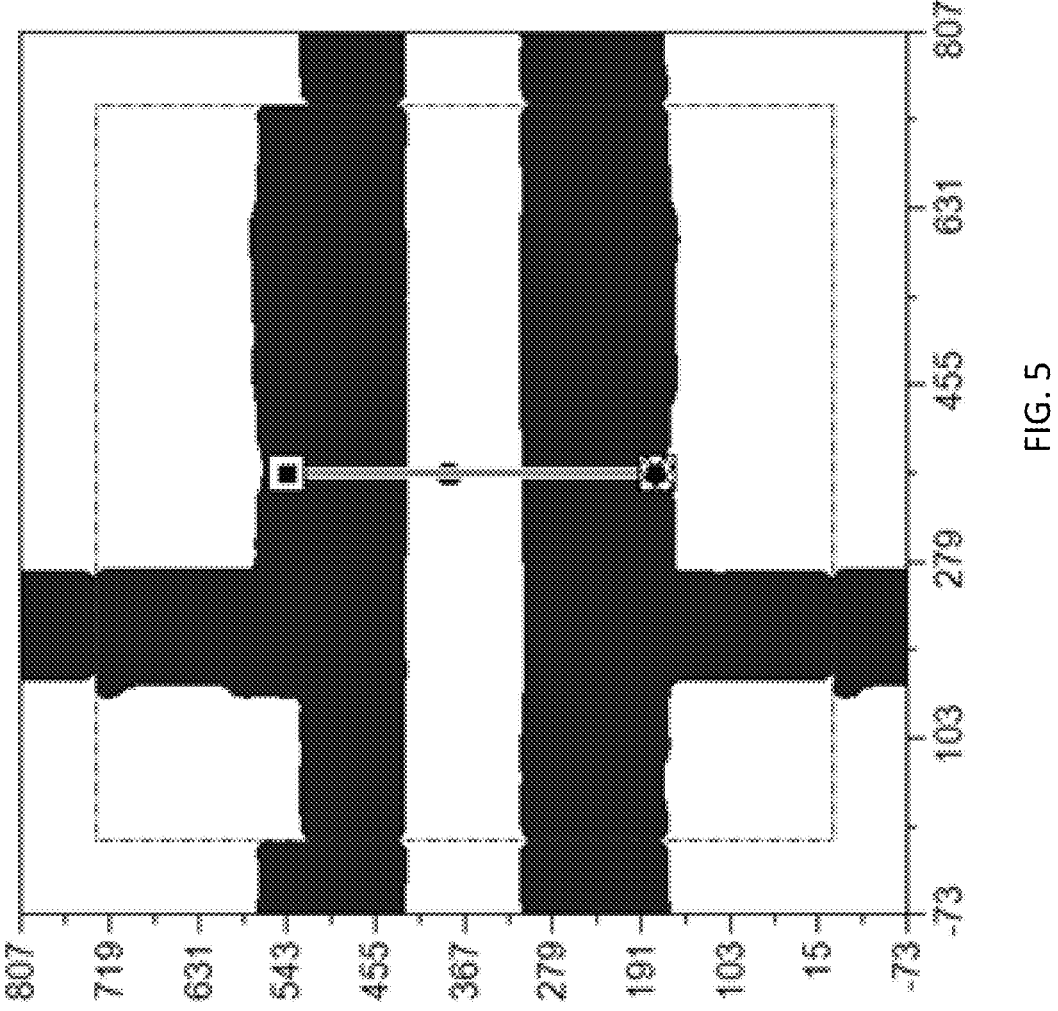
FIG. 5 is a graph showing position of a defect in a photomask.
Figure 6:
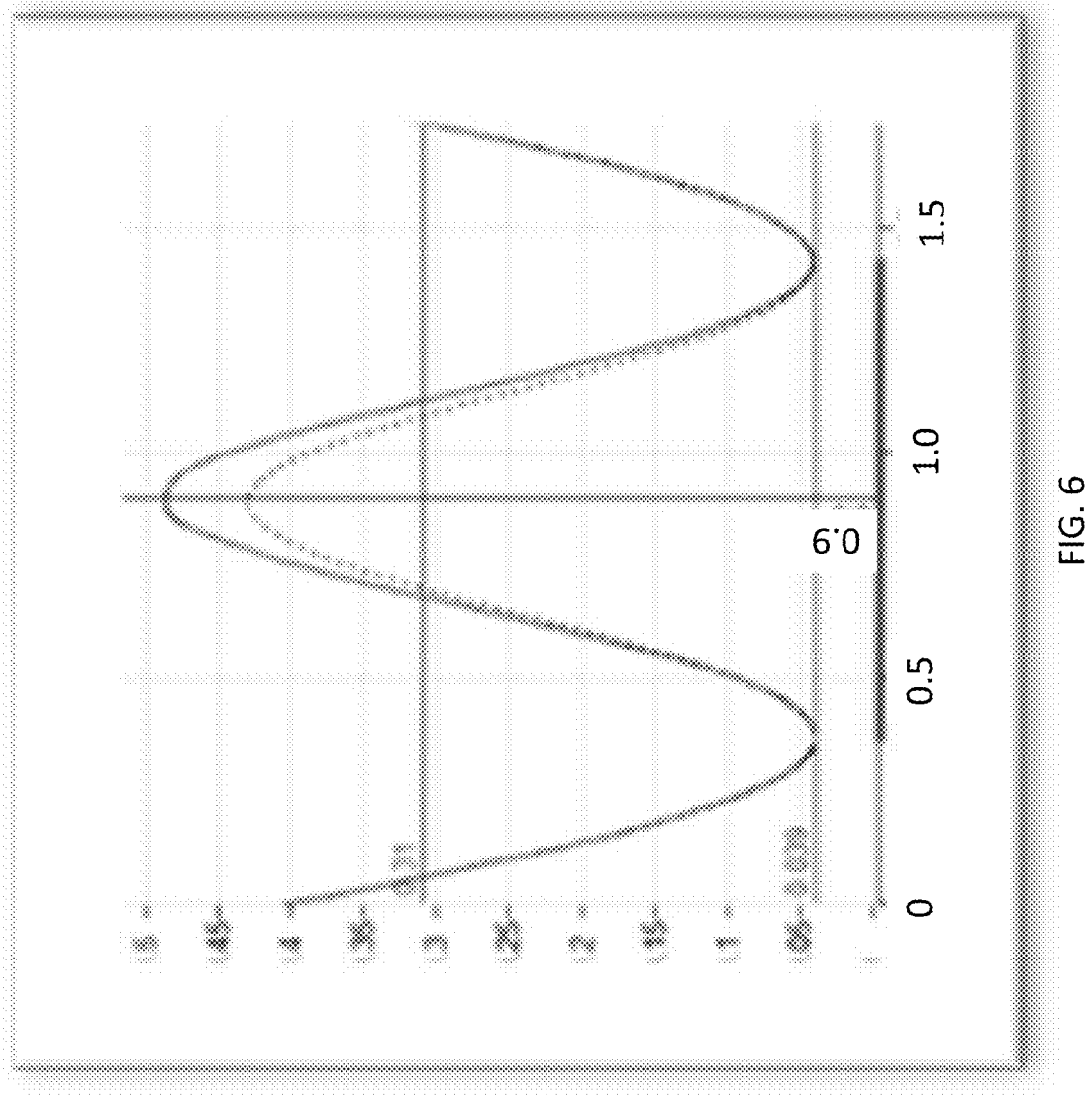
FIG. 6 is a graph showing effect of the defect shown in FIG. 5 on intensity profile.

FIGS. 5 and 6 simulates a correspondence between the pattern and the defect in forming the imaged intensity profile to be conveyed to the substrate by the lithographic scanner, which is needed to resolve patterns. As indicated by the dashed line in FIG. 6, the intensity level is reduced due to the interference between defect and patterns. As a result, intensity profile of the defective pattern will show different pattern quality compared to the non-defective pattern. If the defect size is large and/or highly opaque it will have a more substantial impact on this image light intensity.

Figure 7:
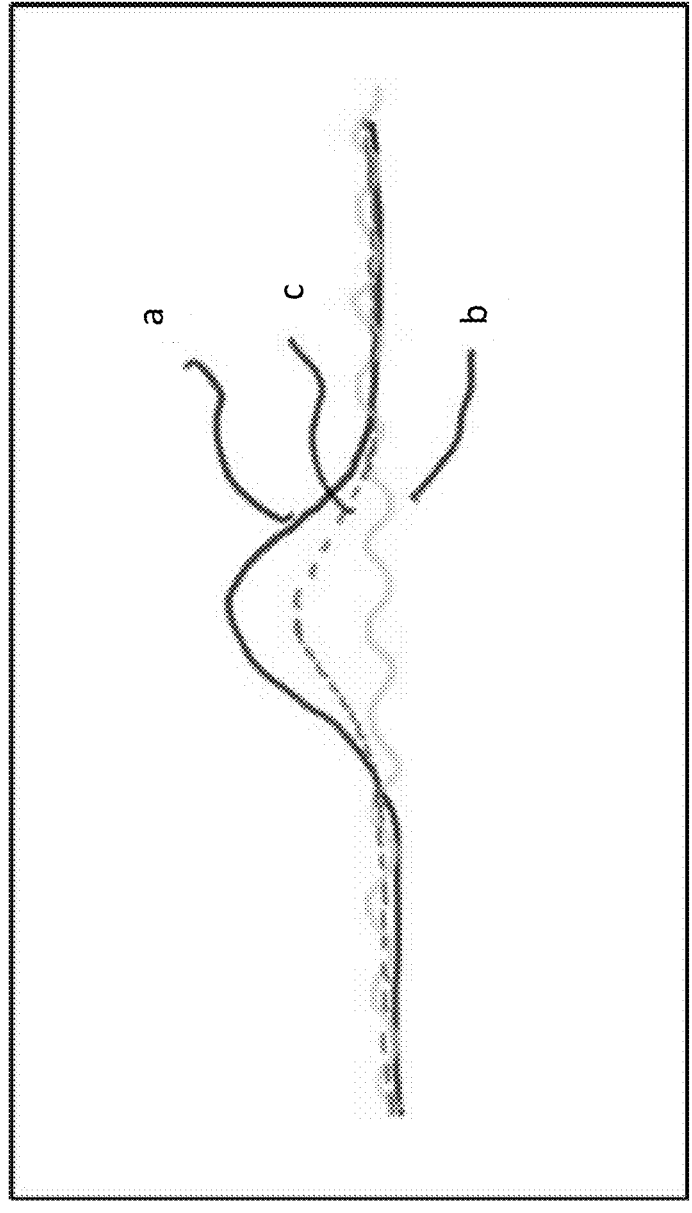
FIG. 7 shows a transmitted wavefront comparison illustrating the change of optical transmission as the light field transfers through the scattering surface in accordance with exemplary embodiments of the present invention.

Methods in accordance with exemplary embodiments of the present invention reduce the effect of inclusion defects by roughening the surface of the mask upon which the inclusion image will arrive. The optical intensity derived from the inclusion defect is scrambled and averaged creating an overall lower intensity but smoother and less defective transmission of light. FIG. 7 shows a transmitted wavefront comparison illustrating the change of optical transmission as the light field transfers through the scattering surface. In particular, curve a in FIG. 7 shows the wavefront resulting from a defect on the glass substrate. The defective optical wavefront has a strong impact on the patterning because the disrupted optical field is free to transmit to the substrate via the lithographic scanner. Curve b shows the wavefront resulting from the same surface after surface roughening and curve c shows the defect strength or impact reduction provided by the roughened surface. The scattering noise imparted to the transmitted wavefront generated from the rough glass surface weakens the optical disturbance of the defect. Therefore, this scatter noise can reduce or remove damaging defect contrast difference.

In embodiments of the present invention, a rough surface on the fine polished imaging surface is produced in order to lessen the impact of defects in the mask especially those of the glass or fused silica inclusion type. As explained, the rough surface gives a blurring defect image by reducing interference effect and also reducing the difference of intensity levels between patterns and defect. The specific process or methods in the FPD blank manufacturing are defined as follows. It will be effective in dispersion defect image.

In exemplary embodiments, the roughened surface may be produced by a grinding and polishing process. Grinding and polishing the glass blank chemically and/or mechanically may be used to control level of surface roughness. The mask blank may be grinded on one side or both sides of the glass. The depth and/or roughness of the scratched surface may be controlled using optimum powder grain.

In exemplary embodiments, an oxidation process may be used to produce the substrate surface roughening. Quartz material is divided from quartz ingot by cutting. Blanks made of the quartz material may then by grinded or polished to make a fine surface. After polishing, the glass surface may be scratched by chemical powder or any grinding particles. The blank may then be subjected to oxidation by placing the blank in a furnace to improve morphology on the surface. The scratched part of the surface typically has a higher oxidation rate or reaction rate. Another surface structure, such as for example an embossing surface, may then be formed on the roughened surface.

In exemplary embodiments, a film coating process may be used to produce the substrate surface roughening. For example, film material with properties similar to that of the substrate may be deposited. Examples of such materials include SiNx and SiOx, to name two.

In exemplary embodiments, a small particle coating may form the surface roughness. For example, size and other properties of the particles may be selected to achieve the desired roughness quality and/or scattering effect.

In exemplary embodiments, acid wet etching may be used to produce the substrate surface roughening.

In exemplary embodiments, other techniques may be used to produce the substrate surface roughening, such as, for example, ionization, and sputtering to add another film, to name two.

In exemplary embodiments, one or more of a variety of techniques may be used in combination to produce the substrate surface roughening.

Figure 8:
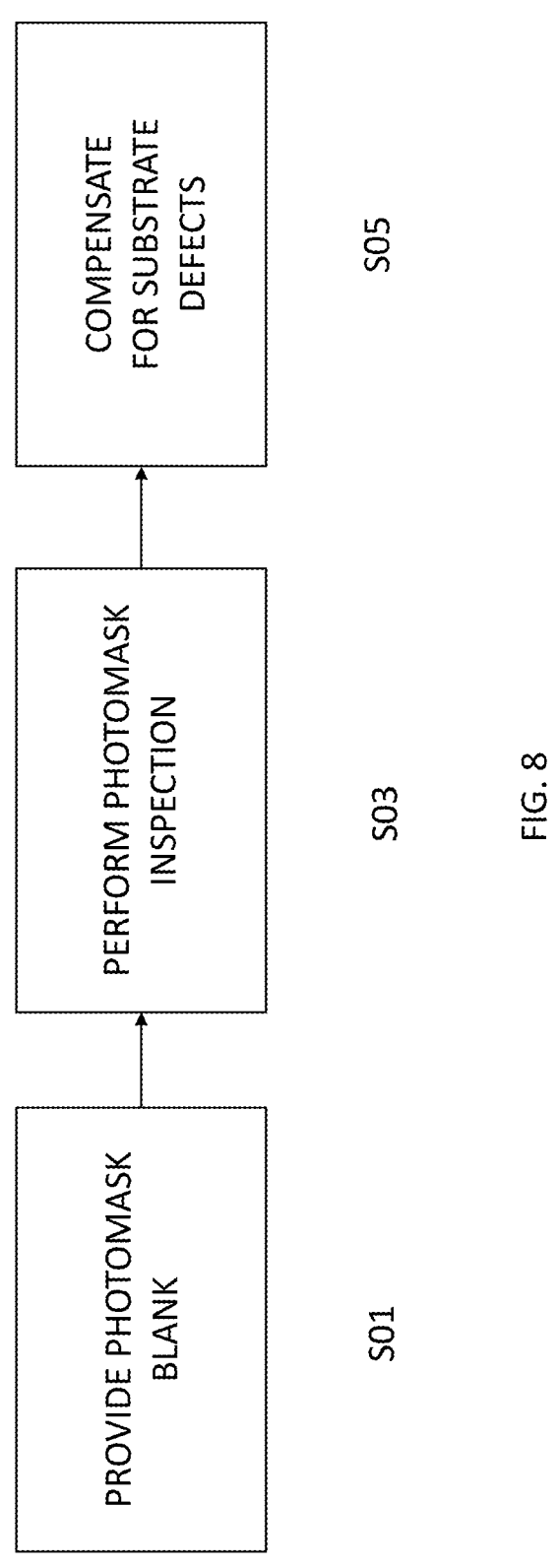
FIG. 8 is a flow diagram of a process for compensating for photomask defects in accordance with exemplary embodiments of the present invention.

FIG. 8 is a flow chart showing a process of making a photomask in accordance with an exemplary embodiment of the present invention. In step S01 of the process, a mask blank is provided, and in step S03 the mask blank is subjected to defect detection. In this regard, photomask blank defect detection systems have been developed and are commercially available. These include systems such those available from KLA Instruments Corp. (Milpitas, California, USA) and Lasertec (Yokohama, Japan), for example. In step S05, the detected defects, particularly those in the substrate of the photomask blank, are compensated for by roughening one or more surface portions of the substrate. Such defects may include, for example, bubbles, scratches, pits and fractures, to name a few. The roughening of the one or more surface portions may be achieved using, for example, grinding, polishing, oxidation, film coating, particle coating, wet etching, ionization, sputtering, and combinations thereof, to name a few.

Figure 9:
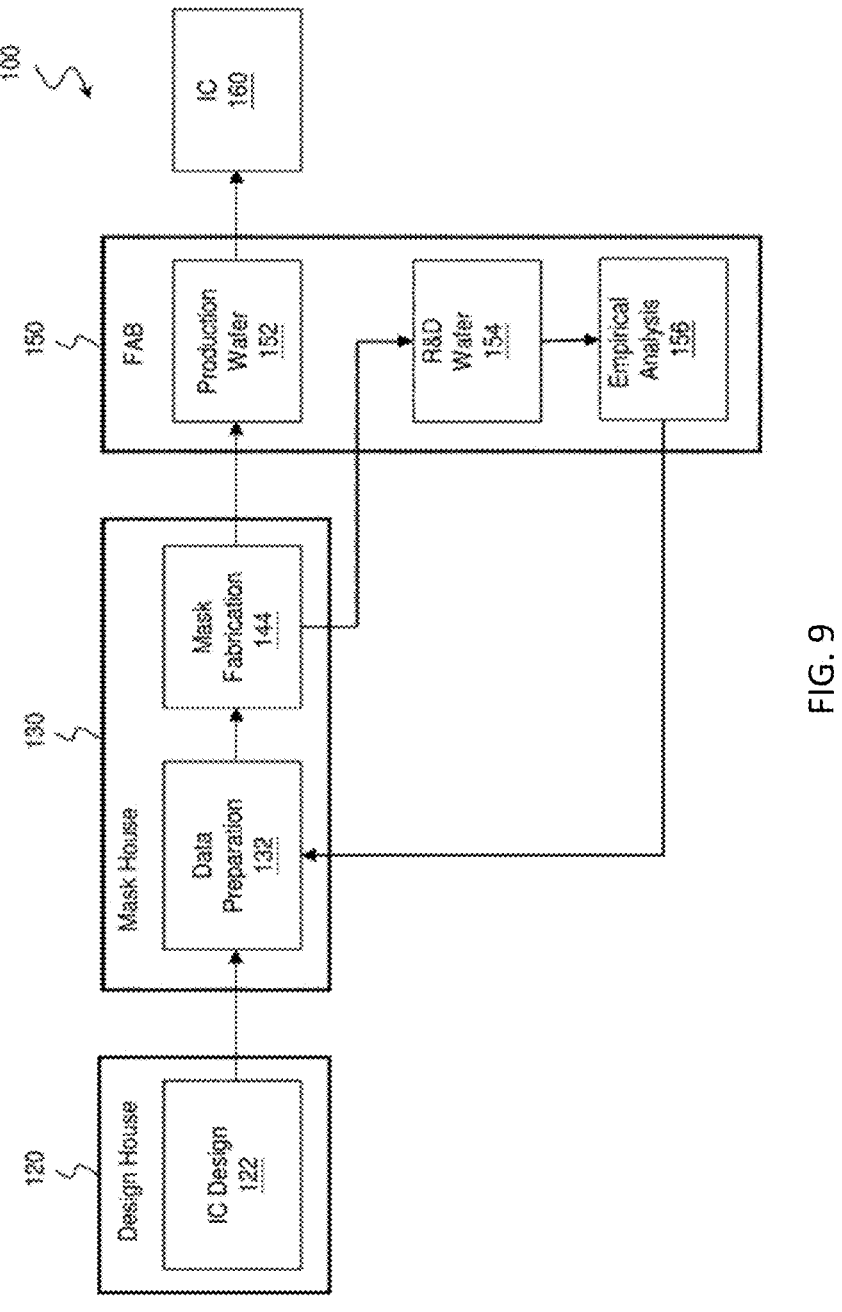
FIG. 9 is a simplified block diagram of an embodiment of a flat panel display (FPD) manufacturing system and an FPD manufacturing flow associated therewith, in accordance with an exemplary embodiment of the present invention.

FIG. 9 is a simplified block diagram of an embodiment of a flat panel display (FPD) manufacturing system 100 and an FPD manufacturing flow associated therewith, in accordance with an exemplary embodiment of the present invention. The FPD manufacturing system 100 includes a plurality of entities, such as a design house 120, a mask house 130, and an FPD manufacturer 150 (i.e., a fab), that interact with one another in the design, development, and manufacturing cycles and/or services related to manufacturing an FPD device 160. The plurality of entities may be connected by a communications network, which may be a single network or a variety of different networks, such as an intranet and the Internet, and may include wired and/or wireless communication channels. Each entity may interact with other entities and may provide services to and/or receive services from the other entities. In embodiments, one or more of the design house 120, mask house 130, and FPD manufacturer 150 may have a common owner, and may even coexist in a common facility and use common resources.

In various embodiments, the design house 120, which may include one or more design teams, generates an FPD design layout 122. The FPD design layout 122 may include various geometrical patterns designed for the fabrication of the FPD device 160. By way of example, the geometrical patterns may correspond to patterns of metal, oxide, or semiconductor layers that make up the various components of the FPD device 160 to be fabricated. The various layers combine to form various features of the FPD device 160, such as, for example, thin film transistors (TFTs). For example, various portions of the FPD design layout 122 may include features such as an active region, a gate electrode, source and drain regions, metal lines or vias of a metal interconnect, openings for bond pads, as well as other features known in the art which are to be formed on an FPD glass substrate and various material layers disposed on the glass substrate. In exemplary embodiments, the design house 120 implements a design procedure to form the FPD design layout 122. The design procedure may include logic design, physical design, and/or place and route. The FPD design layout 122 may be presented in one or more data files having information related to the geometrical patterns which are to be used for fabrication of the FPD device 160. In embodiments, the FPD design layout 122 may be expressed in various formats, such as, for example, an Open Artwork System Interchange Standard (OASIS) file format, a GDSII file format, or DFII file format, to name a few.

In embodiments, the design house 120 may transmit the FPD design layout 122 to the mask house 130, for example, via the network connection described above. The mask house 130 may then use the FPD design layout 122 to manufacture one or more masks to be used for fabrication of the various layers of the FPD device 160 according to the FPD design layout 122. In various examples, the mask house 130 performs mask data preparation 132, where the FPD design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 9, the mask data preparation 132 and mask fabrication 144 are illustrated as separate elements; however, in some embodiments, the mask data preparation 132 and mask fabrication 144 may be collectively referred to as mask data preparation.

In embodiments, the mask data preparation 132 includes application of one or more resolution enhancement technologies (RETs) to compensate for potential lithography errors, such as those that can arise from diffraction, interference, or other process effects. In embodiments, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes. For example, OPC techniques may add sub-resolution assist features (SRAFs), which for example may include adding scattering bars, serifs, and/or hammerheads to the FPD design layout 122 according to optical models or rules such that, after a lithography process, a final pattern on a glass substrate is improved with enhanced resolution and precision. The mask data preparation 132 may also include further RETs, such as off-axis illumination (OAI), phase-shifting masks (PSM), other suitable techniques, or combinations thereof.

In embodiments, the mask data preparation 132 may include a mask process correction (MPC) that is used to correct errors introduced during the mask making process. For example, the MPC may be used to correct mask making process effects such as fogging, development and etch loading and e-beam proximity effects. In embodiments, the MPC process modifies a post-OPC design layout to compensate for limitations which may be encountered during mask fabrication 144.

In embodiments, the mask data preparation 132 may include lithography process checking (LPC) that simulates processing that will be implemented by the FPD manufacturer 150 to fabricate the FPD device 160. The LPC may simulate this processing based on the FPD design layout 122 to create a simulated manufactured device, such as the FPD device 160. The processing parameters in LPC simulation may include parameters associated with various processes of the FPD manufacturing cycle, parameters associated with tools used for manufacturing the FPD, and/or other aspects of the manufacturing process. By way of example, LPC may take into account various factors, such as aerial image contrast, depth of focus (DOF), mask error enhancement factor (MEEF), other suitable factors, or combinations thereof.

In embodiments, after a simulated manufactured device has been created by LPC, if the simulated device layout is not close enough in shape to satisfy design rules, certain steps in the mask data preparation 132, such as OPC and MPC, may be repeated to refine the IC design layout 122 further.

It should be understood that the above description of the mask data preparation 132 has been simplified for the purposes of clarity, and data preparation may include additional features such as a logic operation (LOP) to modify the FPD design layout according to manufacturing rules. Additionally, the processes applied to the FPD design layout 122 during data preparation 132 may be executed in a variety of different orders.

After mask data preparation 132 and during mask fabrication 144, a mask or a group of masks may be fabricated based on the modified FPD design layout. In embodiments, an electron-beam (e-beam) or a mechanism of multiple e-beams is used to form a pattern on a mask (photomask or reticle) based on the modified FPD design layout. In embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In embodiments, a binary mask includes a transparent substrate (e.g., fused quartz) and an opaque material (e.g., chromium) coated in the opaque regions of the mask. In embodiments, the mask is formed using a phase shift technology. In a phase shift mask (PSM), various features in the pattern formed on the mask are configured to have a pre-configured phase difference to enhance image resolution and imaging quality. In embodiments, the phase shift mask can be an attenuated PSM or alternating PSM.

In embodiments, the FPD manufacturer 150 may use the mask (or masks) fabricated by the mask house 130 to transfer one or more mask patterns onto a production glass substrate 152 and thus fabricate the FPD device 160 on the production glass substrate 152. The FPD manufacturer 150 may include an FPD fabrication facility that may include a myriad of manufacturing facilities for the fabrication of a variety of different FPD products. For example, the FPD manufacturer 150 may include a first manufacturing facility for front end fabrication of a plurality of FPD products (i.e., front-end-of-line (FEOL) fabrication), while a second manufacturing facility may provide back end fabrication for the interconnection and packaging of the FPD products (i.e., back-end-of-line (BEOL) fabrication), and a third manufacturing facility may provide other services. In various embodiments, the production FPD 152 within and/or upon which the FPD device 160 is fabricated may include a glass substrate, where the glass type may be, for example, aluminosilicate glass, borosilicate glass, or fused silica, to name a few. In embodiments, a large-size photomask may be appropriately sized to accommodate photolithography processing of glass plate substrates used to form FPDs.

Figure 10:
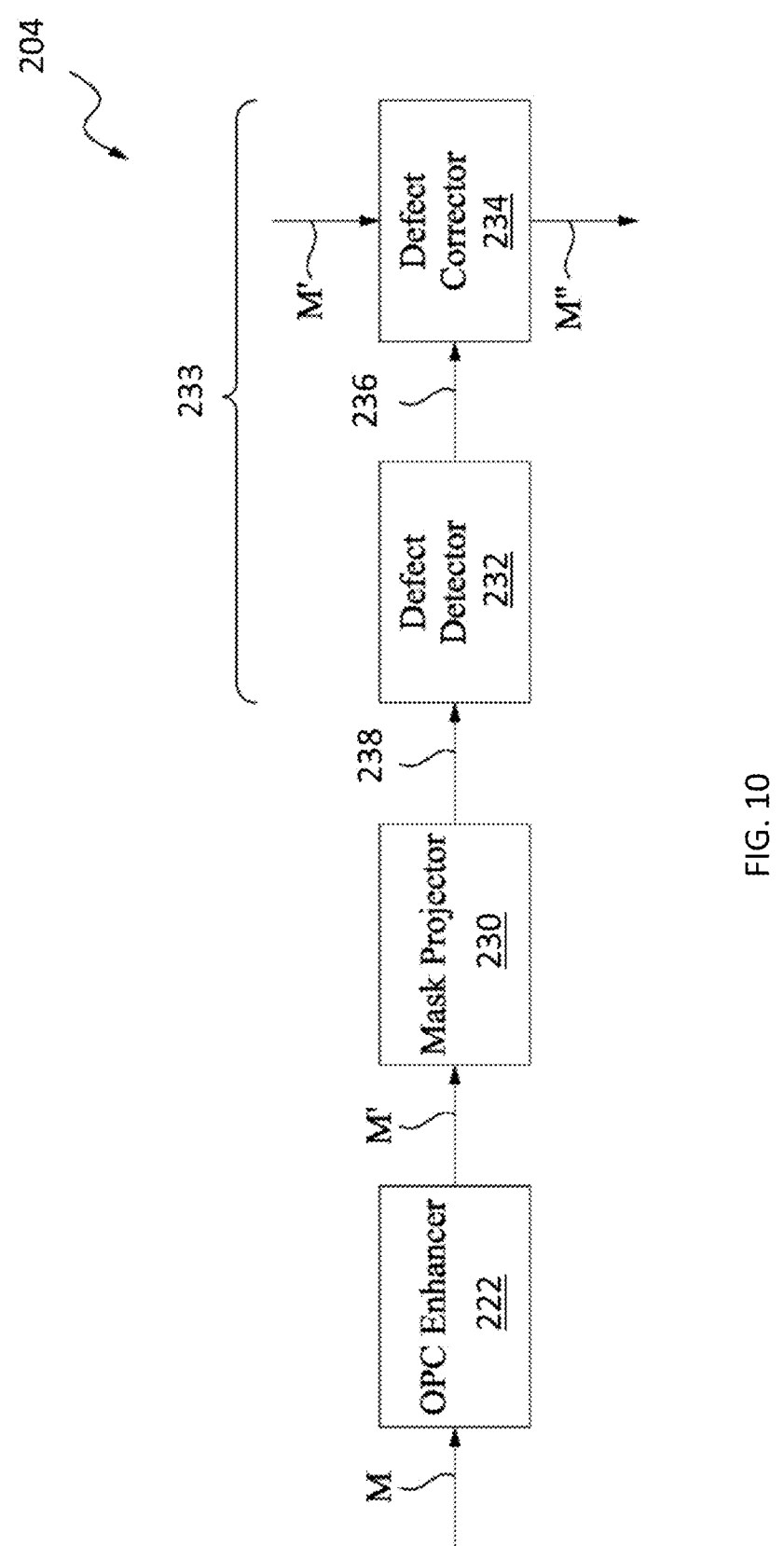
FIG. 10 illustrates a schematic diagram of an exemplary mask enhancer system.

In exemplary embodiments, mask data preparation may involve the use of a mask enhancer system. In this regard, FIG. 10 illustrates a schematic diagram of an exemplary mask enhancer system 204 for enhancing photo mask layouts in accordance with some embodiments. Some embodiments of mask enhancer system 204 include an OPC enhancer 222 that receives the mask layout M that is produced by the design house 120 and produces the OPCed (e.g., the corrected) mask layout M. As described, OPC is a lithography technique that is used to correct or enhance the mask layout M, and produce improved imaging effects to reproduce, on the glass substrate, the original layout drawn by the FPD design house 120. For example, OPC can be used to compensate for imaging distortions due to optical diffraction. In some embodiments, the mask layout M is a data file having the information of the geometrical patterns to be produced on the substrate, and the OPC enhancer 222 modifies the data file and produces a corrected data file representing a corrected mask layout M'.

In exemplary embodiments, a mask projector 230 may be applied on the corrected mask layout M to produce a projected mask layout 238 on the wafer. In some embodiments, corrected mask layout M is a data file and the mask projector 230 simulates the projection of the corrected mask layout M' on the wafer and produces the simulated projected mask layout 238. The defect detector 232 of the mask enhancer 204 inspects the projected mask layout 238 and finds the defective areas 236 of the projected mask layout 238. Although the corrected mask layout M' is OPCed, defective areas may be produced when the corrected mask layout M' is projected on the substrate 208.

In embodiments, a defect corrector 234 of the mask enhancer 204 may receive the defective areas 236 and the corrected mask layout M' and implement further correction, e.g., enhancement, on the corrected mask layout M', thereby producing the enhanced mask layout M". In embodiments, defect detector 232 may be combined into the defect corrector 234 creating a layout detection and correction system 233 that receives the projected mask layout 238 and the corrected mask layout M' and provides the enhanced mask layout M".

Figure 11:
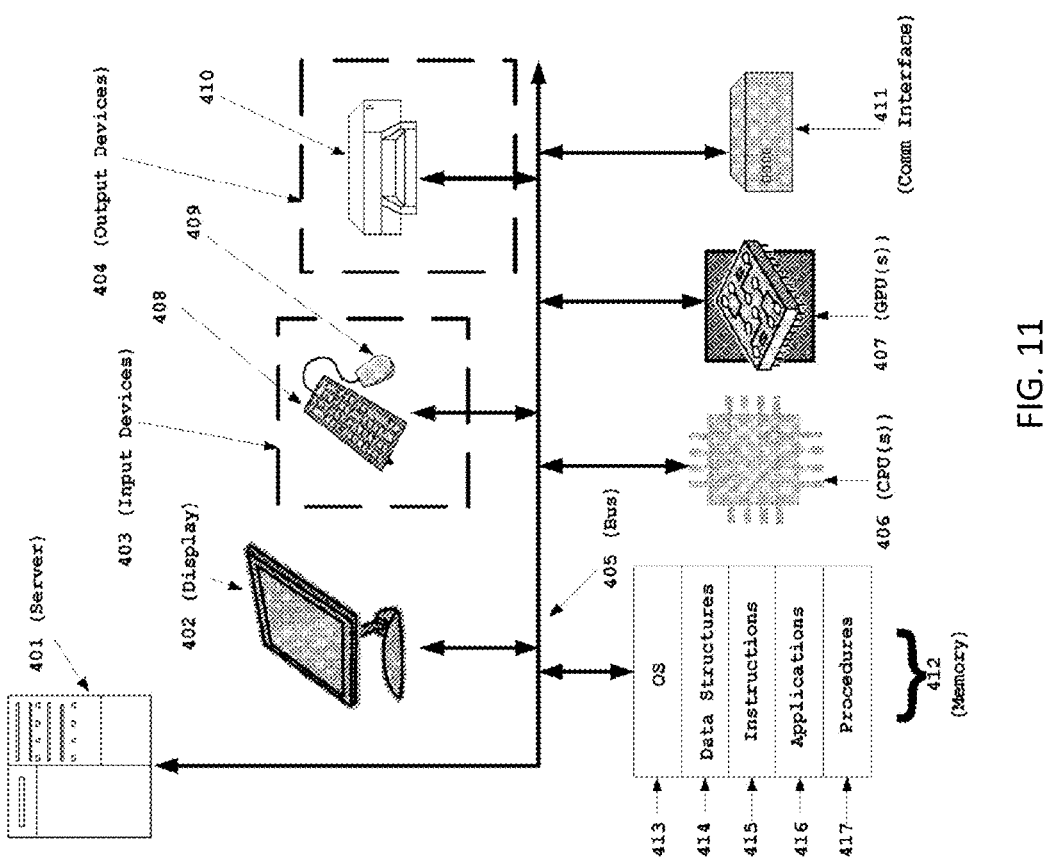
FIG. 11 depicts an exemplary computer system pertaining to a mask enhancer system in accordance with various embodiments of the present invention.

In exemplary embodiments, the mask enhancer system 204 may include specialized hardware components, software components, and/or combinations of both hardware and software components to carry out the various procedures related to enhancement and correction of a photomask as part of an FPD manufacturing process. In this regard, FIG. 11 depicts an exemplary computer system pertaining to a mask enhancer system in accordance with various embodiments of the present invention. In some embodiments, the computer system includes a server 401, display 402, one or more input interfaces 403, and one or more output interfaces

404, all conventionally coupled by one or more buses 405. Examples of suitable buses include, for example, PCI-Express®, AGP, PCI, ISA, and the like, to name a few.

The computer system may include any number of graphics processors. The graphics processor may reside on a motherboard such as being integrated with a motherboard chipset. One or more graphics processors may reside on external boards connected to the system through a bus such as an ISA bus, PCI bus, AGP port, PCI Express, or other system buses, to name a few. Graphics processors may on separate boards, each connected to a bus such as the PCI Express bus to each other and to the rest of the system. Further, there may be a separate bus or connection (e.g., Nvidia SLI or ATI CrossFire connection, to name a two) by which the graphics processors may communicate with each other. This separate bus or connection may be used in addition to or in substitution for system bus.

The server 401 may include one or more CPUs 406, one or more GPUs 407, and one or more memory modules 412. Each CPU and GPU may be a single core or multiple core unit. Examples of suitable CPUs include Intel Pentium®, Intel Core™ 2 Duo, AMD Athlon 64, AMD Opteron®, and the like, to name a few. Examples of suitable GPUs include Nvidia GeForce®, ATI Radeon®, and the like, to name a few. The input interfaces 403 may include a keyboard 408 and a mouse 409. The output interface 404 may include a printer 410.

In embodiments, the communications interface 411 is a network interface that allows the computer system to communicate via a wireless or hardwired network. The communications interface 411, may be coupled to a transmission medium (not shown), such as a network transmission line, for example, twisted pair, coaxial cable, fiber optic cable, and the like, to name a few. In another embodiment, the communications interface 411, provides a wireless interface, that is, the communication interface 411 uses a wireless transmission medium. Examples of other devices that may be used to access the computer system via communications interface 411 include cell phones, PDAs, personal computers, and the like (not shown), to name a few.

The memory modules 412 may generally include different modalities, illustratively semiconductor memory, such as random access memory (RAM), and disk drives as well as others. In various embodiments, the memory modules 412 store an operating system 413, data structures 414, instructions 415, applications 416, and procedures 417.

Storage devices may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

In various embodiments, the specific software instructions, data structures, and data that implement various embodiments of the present invention are typically incorporated in the server 401. Generally, an embodiment of the present invention is tangibly embodied using a computer readable medium, for example, the memory, and includes of instructions, applications, and procedures which, when executed by the processor, causes the computer system to utilize the present invention, for example, the collection and analysis of data, pixelating structures, determining edge placement errors, moving edge fragments, optimizing edge fragment placements, and the like. The memory may store the software instructions, data structures, and data for any of the operating system, the data collection application, the data aggregation application, the data analysis procedures, and the like in semiconductor memory, in disk memory, or a combination of these.

A computer-implemented or computer-executable version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on a mass storage device. The source code of the software of the present invention may also be stored or reside on mass storage device (e.g., hard disk, magnetic disk, tape, or CD-ROM). As a further example, code of the invention may be transmitted via wires, radio waves, or through a network such as the Internet.

The operating system may be implemented by any conventional operating system comprising Windows® (registered trademark of Microsoft Corporation), Unix® (registered trademark of the Open Group in the United States and other countries), Mac OS® (registered trademark of Apple Computer, Inc.), Linux® (registered trademark of Linus Torvalds), as well as others not explicitly listed here.

In various embodiments, the present invention may be implemented as a method, system, or article of manufacture using standard programming or engineering techniques, or both, to produce software, firmware, hardware, or any combination thereof. The term "article of manufacture" (or alternatively, "computer program product") as used in this application is intended to encompass a computer program accessible from any computer readable device, carrier or media. In addition, the software in which various embodiments are implemented may be accessible through the transmission medium, for example, from a server over the network. The article of manufacture in which the code is implemented also encompasses transmission media, such as the network transmission line and wireless transmission media. Thus, the article of manufacture also includes the medium in which the code is embedded. Those skilled in the art will recognize that many modifications may be made to this configuration without departing from the scope of the present invention.

The computer system illustrated in FIG. 11 is not intended to limit the present invention. Other alternative hardware and/or software environments may be used without departing from the scope of the present invention.

While in the foregoing specification a detailed description of a specific embodiment of the invention was set forth, it will be understood that many of the details herein given may be varied considerably by those skilled in the art without departing from the spirit and scope of the invention.

The invention claimed is:

1. A method of manufacturing a photomask, comprising:
   (A) providing a photomask blank comprising a glass substrate;

(B) inspecting the photomask blank to determine presence of one or more defects in the glass substrate; and (C) compensating for the one or more defects by roughening one or more surface portions of the glass substrate, the roughened one or more surface portions configured to remain on the glass substrate and scramble directionality of an optical beam transmitted through the glass substrate during a photolithographic process using a photomask made from the photomask blank.

2. The method of claim 1, wherein the step of compensating comprises roughening one or more surface portions of the glass substrate by at least one of grinding or polishing.

3. The method of claim 1, wherein the step of compensating comprises roughening one or more surface portions of the glass substrate by an oxidation process.

4. The method of claim 1, wherein the step of compensating comprises roughening one or more surface portions of the glass substrate by a film coating process.

5. The method of claim 1, wherein the step of compensating comprises roughening one or more surface portions of the glass substrate by a particle coating process.

6. The method of claim 1, wherein the step of compensating comprises roughening one or more surface portions of the glass substrate by wet etching with an acid etchant.

7. The method of claim 1, wherein the step of compensating comprises roughening one or more surface portions of the glass substrate by ionization.

8. The method of claim 1, wherein the step of compensating comprises roughening one or more surface portions of the glass substrate by sputtering.

9. The method of claim 1, wherein the photomask is a large-size photomask for use in a lithography process to manufacture a flat panel display (FPD).

10. The method of claim 1, further comprising the step of processing the photomask blank.

11. The method of claim 10, wherein the step of processing comprises at least one of etching the photomask blank or exposing the photomask blank to an electron beam or laser energy.

12. A method of making a flat panel display comprising irradiating light from an optical energy source through a large-size photomask made in accordance with the method of claim 10 and onto a glass plate substrate in a photolithographic process so that the at least one circuit pattern is transferred from the large-size photomask to the glass plate substrate.

13. The method of claim 12, wherein the flat-panel display is a liquid crystal display, an active matrix liquid crystal display, an organic light emission diode, a light emitting diode, a plasma display panel, or an active matrix organic light emission diode.

* * * * *